United States Patent
Sun et al.

(10) Patent No.: US 10,205,133 B2
(45) Date of Patent: Feb. 12, 2019

(54) SUBSTRATE LIFTING DEVICE, SUBSTRATE PACKAGING APPARATUS AND SUBSTRATE PACKAGING METHOD

(71) Applicant: BOE TECHNOLOGY GROUP CO., LTD., Beijing (CN)

(72) Inventors: Zhongyuan Sun, Beijing (CN); Xiang Zhou, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days.

(21) Appl. No.: 15/329,166

(22) PCT Filed: Jul. 28, 2016

(86) PCT No.: PCT/CN2016/092004
§ 371 (c)(1),
(2) Date: Jan. 25, 2017

(87) PCT Pub. No.: WO2017/124723
PCT Pub. Date: Jul. 27, 2017

(65) Prior Publication Data
US 2018/0315959 A1    Nov. 1, 2018

(30) Foreign Application Priority Data
Jan. 21, 2016   (CN) .......................... 2016 1 0041128

(51) Int. Cl.
*H01L 21/00*     (2006.01)
*H01L 51/56*     (2006.01)
*H01L 21/683*    (2006.01)

(52) U.S. Cl.
CPC .......... *H01L 51/56* (2013.01); *H01L 21/6838* (2013.01)

(58) Field of Classification Search
CPC ............................. H01L 21/6838; H01L 51/56
See application file for complete search history.

(56) References Cited

U.S. PATENT DOCUMENTS

| 5,492,566 A | 2/1996 | Sumnitsch |
| 6,793,756 B2 | 9/2004 | Lee et al. |

(Continued)

FOREIGN PATENT DOCUMENTS

| CN | 1447159 A | 10/2003 |
| CN | 101026182 A | 8/2007 |

(Continued)

OTHER PUBLICATIONS

First Office Action for Chinese Application No. 201610041128.1 dated Mar. 1, 2017, 6 Pages.

(Continued)

*Primary Examiner* — Richard A Booth
(74) *Attorney, Agent, or Firm* — Brooks Kushman P.C.

(57) ABSTRACT

A substrate lifting device, a substrate packaging apparatus and a substrate packaging method are provided. The substrate lifting device is for lifting a first substrate when the first substrate is aligned to a second substrate, and includes a rotatable mechanism, a rotatable rod, a nozzle and a gas providing mechanism. The rotatable rod is rotatable about the rotatable mechanism. The nozzle is on the rotatable rod. The gas providing mechanism ejects a gas from the nozzle to lift the first substrate.

2 Claims, 2 Drawing Sheets

(56) References Cited

U.S. PATENT DOCUMENTS

| | | | |
|---|---|---|---|
| 2009/0081360 A1* | 3/2009 | Fedorovskaya ... | C23C 16/45529 |
| | | | 427/160 |
| 2013/0260534 A1 | 10/2013 | Khanna et al. | |
| 2014/0182761 A1 | 7/2014 | Hayashi et al. | |
| 2018/0193948 A1* | 7/2018 | Zenou ................. | B23K 26/067 |

FOREIGN PATENT DOCUMENTS

| | | | |
|---|---|---|---|
| CN | 101988623 | A | 3/2011 |
| CN | 103247100 | A | 8/2013 |
| CN | 203134772 | U | 8/2013 |
| CN | 103915365 | A2 | 7/2014 |
| CN | 105702881 | A | 6/2016 |
| JP | 2008070857 | A | 3/2008 |
| JP | 5642239 | B2 | 12/2014 |

OTHER PUBLICATIONS

International Search Report and Written Opinion for Application No. PCT/CN2016/092004, dated Sep. 28, 2016, 13 Pages.

* cited by examiner

SUBSTRATE LIFTING DEVICE, SUBSTRATE PACKAGING APPARATUS AND SUBSTRATE PACKAGING METHOD

CROSS-REFERENCE TO RELATED APPLICATIONS

This application is the U.S. national phase of PCT Application No. PCT/CN2016/092004 filed on Jul. 28, 2016, which claims priority to Chinese Patent Application No. 201610041128.1 filed on Jan. 21, 2016, the disclosures of which are incorporated in their entirety by reference herein.

TECHNICAL FIELD

The present disclosure relates to the field of electrical technology, and in particular, to a substrate lifting device, a substrate packaging apparatus and a substrate packaging method.

BACKGROUND

Organic Light Emitting Diode (OLED), found in the year of 1987 in lab, has been developed remarkably in recent years. Compared with liquid crystal panels, AMOLED has many advantages such as autoluminescence, high contrast, wide viewing angle, low temperature resistance and flexibility. The OLED is a current-driven autoluminescent material, while organic material and metallic cathode are apt to be eroded by water and oxygen and an OLED element may consequently not function normally. In related procedure of manufacturing an OLED display, usually, two glass substrates or two flexible substrates are used, and the OLED element is sandwiched between the two substrates through packaging process, thereby protecting the OLED element from being eroded by water and oxygen.

During an evaporation process for the OLED element, an evaporation glass substrate is arranged with its front downward. After the evaporation process, the evaporation substrate is to be attached to a packaging substrate. Since the OLED element, made of the organic material and cannot be pressed by hard objects, is provided on the evaporation substrate, the evaporation substrate transferred into a device is supported by a peripheral supporter. Then, an upper machine table goes down close to the evaporation substrate and absorbs the evaporation substrate via vacuum absorption. The packaging substrate is placed on a lower machine table. When attaching the evaporation substrate to the packaging substrate, the peripheral supporter is removed and the evaporation substrate absorbed by the upper machine table goes down to attach to the packaging substrate.

In the above evaporation process, no supporter is arranged at the center of the evaporation substrate and the evaporation substrate is merely supported by the peripheral supporter. Due to gravity of the evaporation substrate and stresses generated in prior processes, the center of the evaporation substrate may droop more or less. In the case that the center of the evaporation substrate droops a lot, the upper machine table cannot absorb the evaporation substrate via vacuum absorption, which may adversely affect the attaching process.

SUMMARY

In view of above, the present disclosure provides a substrate lifting device, a substrate packaging apparatus and a substrate packaging method, to prevent problems due to downward bending of a substrate during packaging process.

The present disclosure provides a substrate lifting device for lifting a first substrate when the first substrate is aligned to a second substrate, including a rotatable mechanism, a rotatable rod, a nozzle and a gas providing mechanism. The rotatable rod is rotatable about the rotatable mechanism, the nozzle is arranged on the rotatable rod, and the gas providing mechanism ejects a gas from the nozzle to lift the first substrate.

Optionally, multiple nozzles are provided, a gas pipe is arranged on the rotatable rod, and the multiple nozzles are in communication with the gas pipe and are arranged along the gas pipe.

Optionally, the gas pipe is flexible, the substrate lifting device further includes multiple sliders that are slidable along the rotatable rod, and the multiple nozzles are arranged on the multiple sliders and move as the multiple sliders slide.

Optionally, the gas providing mechanism ejects a protection gas via the nozzle.

Optionally, the protection gas includes nitrogen.

Optionally, the rotatable rod is calibrated.

Optionally, there are at least two rotatable rods.

Optionally, one to six nozzles are arranged on the rotatable rod.

The present disclosure further provides a substrate packaging apparatus for packaging a first substrate and a second substrate, including a machine table and the above substrate lifting device. The nozzle of the substrate lifting device is oriented towards the first substrate.

Optionally, the substrate packaging apparatus further includes a sensor used to detect whether the first substrate is absorbed by the machine table or not.

Optionally, the rotatable rod has such a preset length that enables an area defined by an overall rotating track of the rotatable rod to completely cover an orthogonal projection of the first substrate.

Optionally, there are one to eight substrate lifting devices.

The present disclosure further provides a substrate packaging method for packaging a first substrate and a second substrate using the above substrate packaging apparatus, including steps of: detecting whether the first substrate is absorbed by the machine table or not; rotating the rotatable rod to locate between the first substrate and the second substrate when determining that the first substrate is not absorbed by the machine table; and opening the nozzle to enable the gas ejected out of the nozzle to flow upwardly and lift the first substrate.

Optionally, the first substrate is an OLED evaporation substrate; the substrate packaging apparatus includes the substrate lifting device; the substrate lifting device further includes multiple sliders. The substrate packaging method further includes: adjusting the multiple sliders to enable the gas ejected out of multiple nozzles to reach regions of the first substrate except for a region of an OLED on the first substrate.

In view of above, with the substrate lifting device, the substrate packaging apparatus and the substrate packaging method according to the embodiments of the present disclosure, when packaging the evaporation substrate (the first substrate) and the packaging substrate (the second substrate), gas may be provided to blow and lift the evaporation substrate, such that the upper machine table can completely absorb the evaporation substrate, which facilitates the alignment and packaging of the evaporation substrate and the packaging substrate and prevents the evaporation substrate from getting damaged when being lifted. In the embodiments of the present disclosure, the bended first substrate is lifted by gas, the OLED element or other vulnerable elements on the first substrate may not be touched and therefore may not be damaged due to touch.

DETAILED DESCRIPTION

Technical problems to be solved by the present disclosure, technical solution of the present disclosure and advantages of the present disclosure are clarified hereinafter in conjunction with drawings and specific embodiments.

Firstly, the present disclosure provides a substrate lifting device, used to lift a first substrate when the first substrate is aligned to a second substrate. The substrate lifting device includes a rotatable mechanism 101, a rotatable rod 102 and a nozzle 103 shown in FIG. 1, and includes a gas providing mechanism 306 shown in FIG. 4.

The rotatable rod 102 can rotate about the rotatable mechanism 101. The nozzle 103 is arranged on the rotatable rod 102. The gas providing mechanism ejects gas from the nozzle 103 to lift the first substrate.

Figure 2:
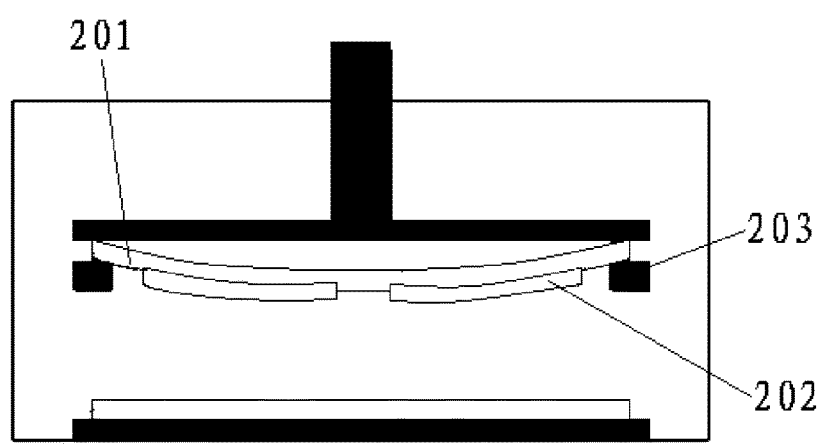
FIG. 2 schematically illustrates substrate packaging in related art.

In related art, as shown in FIG. 2, an OLED element 202 is arranged on an evaporation substrate 201. During an evaporation process for the OLED element, two sides of the evaporation substrate 201 are supported by supporters 203 while the center of the evaporation substrate 201 is supported by nothing. Due to gravity of the evaporation substrate 201, the evaporation substrate 201 may droop at its center.

With the substrate lifting device in the present disclosure, the gas is ejected from the nozzle to the first substrate to lift the first substrate. In the case that the first substrate is an evaporation substrate in a packaging process, a portion of the evaporation substrate where droops can be lifted by the gas from the nozzle; hence, the droop is alleviated, the evaporation substrate or the first substrate may not droop badly during alignment process, and accordingly, the upper machine table may not fail in absorbing the evaporation substrate. In embodiments of the present disclosure, the first substrate is lifted by gas and may not get stained or damaged as lifted by a mechanical lifting mechanism or by a hand.

In some embodiments of the present disclosure, the gas providing mechanism may be a gas pump having an adjustable gas ejection power. Since the substrate is lifted by an external force from the gas, the external force for lifting the substrate can be adjusted according to needs and the substrate may not be damaged by excessive force.

Figure 1:
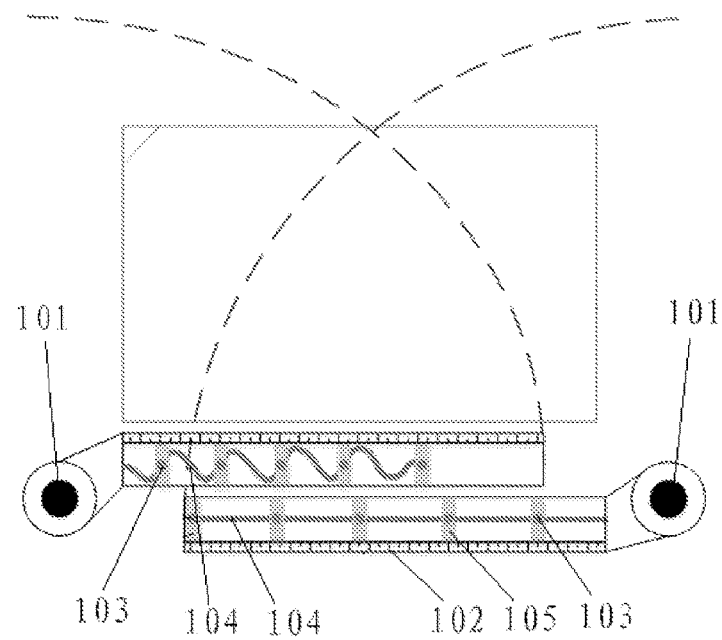
FIG. 1 is a schematic structural diagram of a substrate lifting device according to some embodiments of the present disclosure.

In some embodiments of the present disclosure, still as shown in FIG. 1, multiple nozzles 103 are provided, a gas pipe 104 is arranged on the rotatable rod 102, the nozzles 103 are in communication with the gas pipe 104 and are arranged along the gas pipe 104.

Optionally, multiple openings are arranged on the gas pipe 104 at positions corresponding to the multiple nozzles 103, and the gas pipe 104 is in communication with the nozzles 103 sealedly via the multiple openings. In addition, an end of the gas pipe 104 is in communication with the gas providing mechanism. The gas is transferred from the gas providing mechanism to the nozzles 103 via the gas pipe 104.

In some embodiments of the present disclosure, still as shown in FIG. 1, the gas pipe 104 is flexible. The substrate lifting device further includes a slider 105 that is slidable along the rotatable rod 102, and the nozzle 103 is arranged on the slider 105 and can move as the slider 105 slides.

With the substrate lifting device according to the embodiments of the present disclosure having the above-described structure, a gas providing position can be adjusted according to characteristics of the substrate; hence, the substrate can be applied with an even lifting force and the substrate lifting device can be applied to substrates of various sizes.

In some embodiments of the present disclosure, the gas providing mechanism ejects a protection gas via the nozzle, that is, the gas ejected from the gas providing mechanism is the protection gas. A material coated on the first substrate may not react with the protection gas, thereby protecting the substrate. The protection gas do not react easily with other substances, for example, may be an inert gas.

In some embodiments of the present disclosure, the protection gas includes nitrogen, which is common and can be easily obtained from the air; hence, the cost is low and the substrate can be well protected.

In some embodiments of the present disclosure, the gas ejected out of the nozzle is high purity nitrogen, and the position of the nozzle is adjustable. The nozzle is designed with an adjustable position and can eject high purity nitrogen at a certain gas pressure. An upward force provided by the high purity nitrogen counteracts a force that bends the evaporation substrate, such that the evaporation substrate returns to flat and can be absorbed by the upper machine table, thereby solving the problem that a bended first substrate cannot be well absorbed.

In some embodiments of the present disclosure, still as shown in FIG. 1, the rotatable rod 102 is calibrated, such that the position of the nozzle 103 can be adjusted accurately.

In some embodiments of the present disclosure, still as shown in FIG. 1, there are at least two rotatable rods 102.

In some embodiments of the present disclosure, still as shown in FIG. 1, there are one to six nozzles 103 on each rotatable rod 102, and a pressure of the ejected gas ranges from 0.005 Mpa to 0.08 Mpa.

According to experiments, a bended glass substrate having a certain size can be lifted by high purity nitrogen having a corresponding pressure ejected out of a corresponding quantity of nozzle. Considering characteristics of majority substrates and in order to adapt to glass substrates of various sizes, one to six nozzles are arranged on each calibrated rod, and the pressure of the high purity nitrogen ejected out of the one to six nozzles ranges from 0.005 Mpa to 0.08 Mpa.

Figure 3:
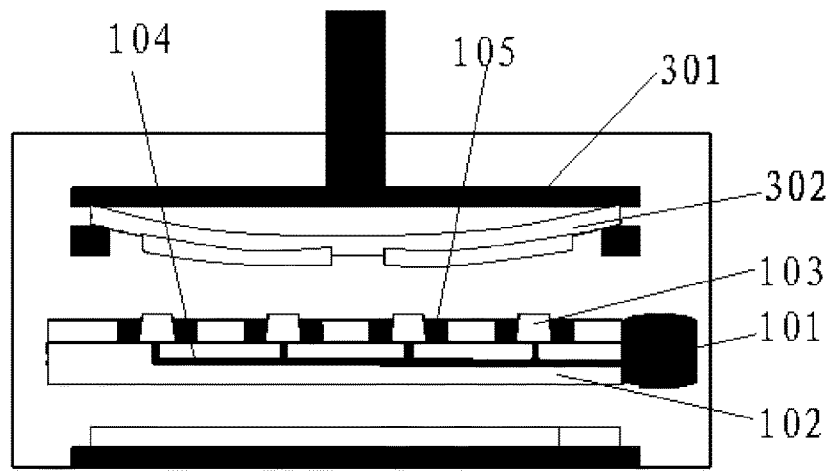
FIG. 3 is a schematic structural diagram of a substrate packaging apparatus according to some embodiments of the present disclosure.

Furthermore, the present disclosure provides a substrate packaging apparatus for packaging a first substrate and a second substrate. As shown in FIG. 3, the substrate packaging apparatus includes an upper machine table 301 for absorbing the first substrate and the substrate lifting device according to any of the foregoing embodiments. The nozzle of the substrate lifting device is arranged facing the first substrate. In the case that the first substrate 302 bends, the upper machine table 301 cannot absorb the first substrate 302, a sensor on the upper machine table 301 may sense the bending of the first substrate 302 and may send a signal indicating abnormal substrate absorption; here, the rotatable rod 102 provided with the nozzle 103 may rotate to locate below the first substrate 302, high purity nitrogen may be ejected out of the nozzle 103 at a certain pressure and may lift the bended first substrate 302 such that the first substrate 302 can be absorbed by the upper machine table 301.

Figure 4:
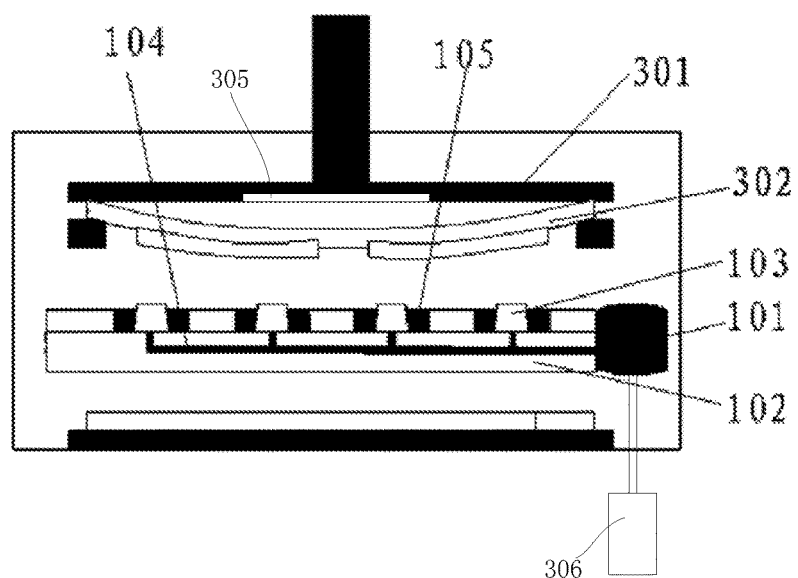
FIG. 4 is a detailed schematic structural diagram of a substrate packaging apparatus according to some embodiments of the present disclosure.

In some embodiments of the present disclosure, the substrate packaging apparatus further includes a sensor 305 as shown in FIG. 4. The sensor 305 is to detect whether the first substrate is absorbed by the upper machine table or not.

In some embodiments of the present disclosure, still as shown in FIG. 1, the rotatable rod 102 has a preset length that ensures an area defined by an overall rotating track of the rotatable rod 102 can completely cover an orthogonal projection of the first substrate. The overall rotating track is represented by a dash line in FIG. 1.

In accordance with lengths of majority second substrates, in some embodiments of the present disclosure, there is one to eight substrate lifting devices.

Furthermore, the present disclosure provides a substrate packaging method, for packaging a first substrate and a second substrate using the substrate packaging apparatus according to any one of the foregoing embodiments.

The substrate packaging method includes: detecting whether the first substrate is absorbed by a machine table or not; rotating the rotatable rod to locate between the first substrate and the second substrate in the case that it is determined that the first substrate is not absorbed by the machine table; and opening the nozzle to enable a gas ejected out of the nozzle to flow upwardly and lift the first substrate.

In some embodiments of the present disclosure, the first substrate is an OLED evaporation substrate, the gas pipe of the substrate packaging apparatus is flexible, the substrate lifting device further includes a slider that is slidable along the rotatable rod and the nozzle is provided on the slider and may move as the slider slides. Accordingly, the substrate packaging method further includes: adjusting the slider to enable the gas ejected out of the nozzle to reach regions of the first substrate in addition to a region of an OLED on the first substrate.

The OLED may get damaged when subjected to an external force; hence, the OLED can be protected by adjusting the position of the nozzle and prevent the gas from reaching the region of the OLED.

In view of above, with the substrate lifting device, the substrate packaging apparatus and the substrate packaging method according to the embodiments of the present disclosure, when packaging the evaporation substrate (the first substrate) and the packaging substrate (the second substrate), gas may be provided to blow and lift the evaporation substrate, such that the upper machine table can completely absorb the evaporation substrate, which facilitates the alignment and packaging of the evaporation substrate and the packaging substrate and prevents the evaporation substrate from getting damaged when being lifted. In the embodiments of the present disclosure, the bended first substrate is lifted by gas, the OLED element or other vulnerable elements on the first substrate may not be touched and therefore may not be damaged due to touch.

It should be noted that, the embodiments disclosed in the specification are merely for explaining the present disclosure, rather than for limiting the present disclosure. The embodiments and features in the embodiments can be combined if no confliction may be caused.

Apparently, the ordinary skilled in the art can make various modifications and variations without departing from the principle and scope of the present disclosure, and all those modifications and variations fall within protection scope of the present disclosure.

What is claimed is:

1. A substrate packaging method for packaging a first substrate and a second substrate using
a substrate packaging apparatus which comprises: a machine table; and a substrate lifting device, wherein the substrate lifting device comprises: a rotatable mechanism, a rotatable rod, a nozzle and a gas providing mechanism; wherein the rotatable rod is rotatable about the rotatable mechanism, the nozzle is on the rotatable rod, and the gas providing mechanism ejects a gas from the nozzle to lift the first substrate; and the nozzle of the substrate lifting device is oriented towards the first substrate,
wherein the substrate packaging method comprises:
detecting whether the first substrate is absorbed by the machine table of the substrate packaging apparatus or not;
rotating the rotatable rod of the substrate packaging apparatus to locate between the first substrate and the second substrate when determining that the first substrate is not absorbed by the machine table; and
opening the nozzle of the substrate packaging apparatus to enable gas ejected out of the nozzle to flow upwardly and lift the first substrate.

2. The substrate packaging method according to claim 1, wherein the first substrate is an OLED evaporation substrate; the substrate lifting device of the substrate packaging apparatus comprises a plurality of nozzles; a gas pipe is on the rotatable rod and the plurality of nozzles is in communication with the gas pipe and is arranged along the gas pipe; the substrate lifting device further comprises a plurality of sliders that is slidable along the rotatable rod and the plurality of nozzles is on the plurality of sliders; and the rotatable rod is calibrated;
the substrate packaging method further comprises:
adjusting the plurality of sliders to enable the gas ejected out of the plurality of nozzles to reach regions of the first substrate except for a region of an OLED on the first substrate.

* * * * *